United States Patent [19]
Koyama et al.

[11] Patent Number: 6,031,319
[45] Date of Patent: Feb. 29, 2000

[54] QUARTZ CRYSTAL ELEMENT USING A THICKNESS SHEAR HEXAGONAL QUARTZ BLANK AND METHOD FOR MANUFACTURING THE SAME

[75] Inventors: Mitsuaki Koyama; Shigenori Watanabe; Tadashi Tamiya; Keisuke Miyashita, all of Saitama; Chiaki Kato; Shuzi Osawa, both of Niigata, all of Japan

[73] Assignee: Nihon Dempa Kogyo Co., Ltd., Tokyo, Japan

[21] Appl. No.: 09/038,040

[22] Filed: Mar. 11, 1998

[30] Foreign Application Priority Data

Mar. 31, 1997 [JP] Japan .................................... 9-098310
Jun. 27, 1997 [JP] Japan .................................... 9-187669
Jul. 14, 1997 [JP] Japan .................................... 9-205380
Nov. 7, 1997 [JP] Japan .................................... 9-322510

[51] Int. Cl.[7] .......................... H03H 9/19; H01L 41/053
[52] U.S. Cl. ............................................ 310/348; 310/367
[58] Field of Search ............................ 310/340, 344, 310/348, 352, 367

[56] References Cited

U.S. PATENT DOCUMENTS

| | | | |
|---|---|---|---|
| 2,119,848 | 6/1938 | Hawk | 310/367 |
| 2,802,955 | 8/1957 | Kitterman | 310/348 |
| 4,079,281 | 3/1978 | Nakayama et al. | 310/360 |
| 4,454,443 | 6/1984 | Lukaszek et al. | 310/348 |

FOREIGN PATENT DOCUMENTS

| | | | |
|---|---|---|---|
| 52-17784 | 2/1977 | Japan | 310/348 |
| 53-32691 | 3/1978 | Japan | 310/367 |
| 57-147314 | 9/1982 | Japan | 310/348 |
| 62-152208 | 7/1987 | Japan | 310/348 |
| 1-268304 | 10/1989 | Japan | 310/348 |
| 4-77010 | 3/1992 | Japan | 310/348 |
| 6-132773 | 5/1994 | Japan | 310/344 |

*Primary Examiner*—Thomas M. Dougherty
*Attorney, Agent, or Firm*—Oblon, Spivak, McClelland, Maier & Neustadt, P.C.

[57] ABSTRACT

A quartz crystal element in which unwanted response is suppressed, comprising a thickness shear quartz blank such as an AT-cut type. An area where an amplitude of unwanted response may be strong can be eliminated from the quartz blank by forming the quartz blank into a substantially hexagon. Preferably, each pair of three pairs of opposite sides are mutually parallel and one of the pairs is parallel to the longest diagonal line of the quartz blank. For an AT-cut type of quartz crystal element, the direction of the longest diagonal line of the quartz blank is within the range of 28°±15° or 118°±15° from the Z' axis direction of the quartz blank, and the quartz blank is held at the ends of the longest diagonal line.

8 Claims, 8 Drawing Sheets

QUARTZ CRYSTAL ELEMENT USING A THICKNESS SHEAR HEXAGONAL QUARTZ BLANK AND METHOD FOR MANUFACTURING THE SAME

BACKGROUND OF THE INVENTION

1. Field of the Invention

The present invention relates to a thickness shear mode quartz crystal element which may have a considerably compact shape and provide good vibration characteristics, and a method for manufacturing the same.

2. Description of the Prior Art

Recently, piezoelectric elements have been frequently used as a reference for frequency or time in a various kinds of electronic devices. Among the piezoelectric elements, a quartz crystal element with synthetic quartz has been widely used in many types of electronic devices since it has physically and electrically outstanding characteristics and can be supplied in a large quantity. As there have been increased needs for more compact and lighter electronic devices, a quartz crystal element has been needed to be more compact. A compact quartz blank for a quartz crystal element has been conventionally strip-shaped or circular.

Quartz crystal elements can be classified into AT-cut, BT-cut or the like according to a cutting direction of a quartz blank from a single crystal of quartz. Furthermore, according to the cutting direction of the quartz blank, quartz crystal elements can be classified into vibration modes such as thickness shear, stretching and tuning-fork modes. In particular, an AT-cut quartz crystal element may be easily miniaturized, provides a convenient resonance frequency and has a temperature coefficient of nearly zero, and thus it is most widely used. An AT-cut quartz crystal element operates in a thickness shear mode. As is well known, X, Y and Z axes are crystallographically defined for quartz. An AT-cut quartz blank is cut from an X–Z' plane which is taken by rotating an X–Z plane of a quartz crystal by about +35° around the X axis of the crystal. In such a quartz blank, it is known that a direction rotated by about 28° to the X axis from the Z' axis is an axis direction of zero stress sensitivity in which frequency change against stress impressed from outside become minimum. Specifically, AT-cut quartz crystal elements include one using a regular square crystal blank, one of whose diagonal lines is the above axis of zero stress sensitivity and which is held at the both ends of the diagonal line.

It is believed to be desirable that an area of a quartz blank of an AT-cut quartz crystal element is large for providing ideal vibration characteristics. In an AT-cut quartz crystal element, size reduction of a quartz blank for miniaturization may cause deterioration in vibration characteristics such as an unwanted response point with a frequency different from that of the principal resonance; marked reduction in Q (quality factor) value; and sudden jumping of the resonance frequency due to some temperature variation. Thus, excessive size reduction of a quartz blank may often lead to an impractical quartz crystal element.

Problems such as unwanted response and jumping of a resonance frequency are not limited to the AT-cut quartz crystal element, but may be observed in a quartz crystal element in general. The smaller the quartz blank is, the more difficult control of unwanted response is; the more readily jumping of the resonance frequency may be caused by temperature variation; and the higher the electric impedance is, causing it difficult to provide appropriate vibration. For a quartz crystal element with a strip-shaped quartz blank, size reduction of its longer edge to about 5 mm may make it quite difficult to provide good vibration characteristics and are liable to cause strong unwanted response. Therefore, in manufacturing a small size of quartz crystal element, it is necessary to find a quartz blank which can provide good vibration characteristics, by, for example, gradually changing the width of the quartz blank. It may require a large amount of time and labor.

Furthermore, a conventional quartz crystal element has problems in mounting during enclosing a quartz blank in a case. FIG. 1 is a perspective view of configuration of a conventional quartz crystal element where a quartz blank is enclosed in a metal case. A pair of lead wires 2 are implanted on a base 1 and mutually insulated. To the tips of the lead wires 2, holding members 3 which are made of ribbon-like metal sheets and face each other are adhered by, for example, welding. A slot 4 with a defined width is formed on each of the holding members 3 along the longitudinal direction the holding member 3.

A quartz blank 5 is formed as, for example, a circle and ground to a thickness depending on a desired resonance frequency. Excitation electrodes 6 are formed on the major surfaces of the quartz blank 5, respectively. The excitation electrodes 6 are extended in mutually opposite directions and led to the plate edges of the quartz blank 5. The leading ends are inserted into and then, with conductive adhesive 7, adhered to the slots 4 of the holding members 3. Thus, the quartz blank 5 is held by the holding members 3. Then, a case 8 is placed, which is then sealed on the base 1 with filling an inert gas thereto to provide a quartz crystal element.

The length held by the slots is shorter for a strip-shaped or square quartz blank than for a circular one. When the length held by the slots is short and the slot width is relatively wider to the thickness of the quartz blank, the quartz blank becomes indirectly held only by conductive adhesive. In such conditions, a quartz crystal element may exhibit poor vibration resistance, poor shock resistance and aged deterioration.

Thus, the quartz blank is preferably clamped in the slots and auxiliarily adhered to them with conductive adhesive to ensure mechanical holding and electric conduction, resulting in good vibration resistance, good shock resistance and small aged deterioration. It is, therefore, desirable that the width of the slot corresponds to the thickness of the quartz blank.

However, in a thickness shear quartz crystal element, the resonance frequency depends on the thickness of the quartz blank. Thus, if it is desired to use a holding member with a slot width corresponding to the thickness of the quartz blank, there should be prepared many holding members different in their slot width depending on a given resonance frequency, which is impractical.

Recently, surface mounting types of electronic parts have been increasingly used because of miniaturization of electronic devices and increasing automation of their assembling processes. Thus, more compact surface-mounting types of quartz crystal elements have come to be desired. There are, however, some problems to be solved for achieving compact surface-mounting quartz crystal elements.

Since a quartz crystal element utilizes piezoelectric vibration of quartz, a quartz blank should be held in space and placed in a chemically and physically stable atmosphere. The quartz blank should be, therefore, held in a case having an adequate volume and the case should be tightly sealed. However, it is now difficult to accurately place and hold a small quartz blank in a compact surface-mounting type of case and to ensure sealing of the case. Furthermore, for obtaining a surface-mounting type of a quartz crystal element, the size of the quartz blank should be considerably smaller than any of those of the prior art. In such a quartz blank, it is, however, difficult to provide good vibration characteristics, as described above.

SUMMARY OF THE INVENTION

The first object of the present invention is to provide a compact quartz crystal element having good vibration characteristics and suitable for a large scale production.

The second object of the present invention is to provide a quartz crystal element in which a polygonal quartz blank of thickness share mode can be firmly held; there are provided good vibration resistance, good shock resistance and reduced aged deterioration; and components can be reasonably controlled, resulting in cost reduction.

The third object of the present invention is to provide a compact surface-mounting quartz crystal element having good vibration characteristics.

Another object of the present invention is to provide a thickness shear quartz crystal element having an improved efficiency in utilizing the area of a quartz plate taken from a quartz crystal member.

Further object of the present invention is to provide a method for manufacturing a thickness shear quartz crystal element having an improved efficiency in utilizing the area of a quartz plate taken from a quartz crystal body.

The present inventors have intensively investigated for putting a subminiature quartz crystal element having good vibration characteristics to practical use. Thus, we have found that a compact quartz crystal element without deterioration of vibration characteristics can be obtained by shaping a quartz blank in a hexagon instead of a parallelogram of the prior art, using an axis direction of zero stress sensitivity as a reference line in the quartz blank of thickness shear mode. As described later, a direction perpendicular to the axis direction of zero stress sensitivity may be selected as a reference line.

Specifically, a quartz blank may be shaped in a hexagon in advance. Alternatively, of four corners of a parallelogrammatic quartz blank, two not on the above reference line may be removed along lines at a given distance from and parallel to the reference line to provide a hexagon. Further, as described later, four hexagonal quartz blanks may be taken from one circular quartz plate. When such a hexagonal quartz blank is held to be used as a quartz crystal element, it is preferably held at the ends of the reference line.

Of course, it is not necessarily required that the axis direction of zero stress sensitivity and the reference line are exactly identical or orthogonal. Practically, it may be allowable that the reference line is within ±15° to the axis direction of zero stress sensitivity or a direction perpendicular to the axis direction; preferably within ±10° and more preferably within ±5°.

In this invention, it is not necessarily required that the shape of the quartz blank is geometrically a strict hexagon. In other words, some of the six sides of the hexagon may be curves such as an arc instead of a straight line. In the present invention, a curved side which is parallel to a given object, means that the line segment between the ends of the side is parallel to the object. Here, ends of a curved side are vertices of the hexagon.

The present invention will be described in detail. FIG. 2 shows a distribution of displacement when a small quartz blank is used in an AT-cut quartz crystal element. There occurs principal displacement 11 at the central part of the quartz blank 10. The principal displacement 11 is wanted response of the quartz blank and is the biggest displacement generated on the surface of the quartz blank 10. The symbol 12 indicates unwanted response of contour vibration mode having most adversely affection to the quartz crystal element. Relatively stronger unwanted response 12 exist at each of four points at the nearly same distance from the center of the quartz blank 10. Considering a straight line L passing through the center of the quartz blank 10 and extending to a direction of zero stress sensitivity, the positions of unwanted response 12 are symmetrically placed to the line L. Hence, a quartz crystal element little influenced by unwanted response 12 may be provided by taking a hexagonal quartz blank 13 as described above, selecting the line L or a line perpendicular to the line L as a reference line.

In an AT-cut quartz blank 10, the line L has an angle of 28° to Z' axis. Thus, it can be understood that the quartz blank 13 is formed in a manner that the straight line between the holding ends has an angle of 28°±15° or 118°±15° from Z' axis of the plate surface.

DESCRIPTION OF THE PREFERRED EMBODIMENTS

Figure 3:
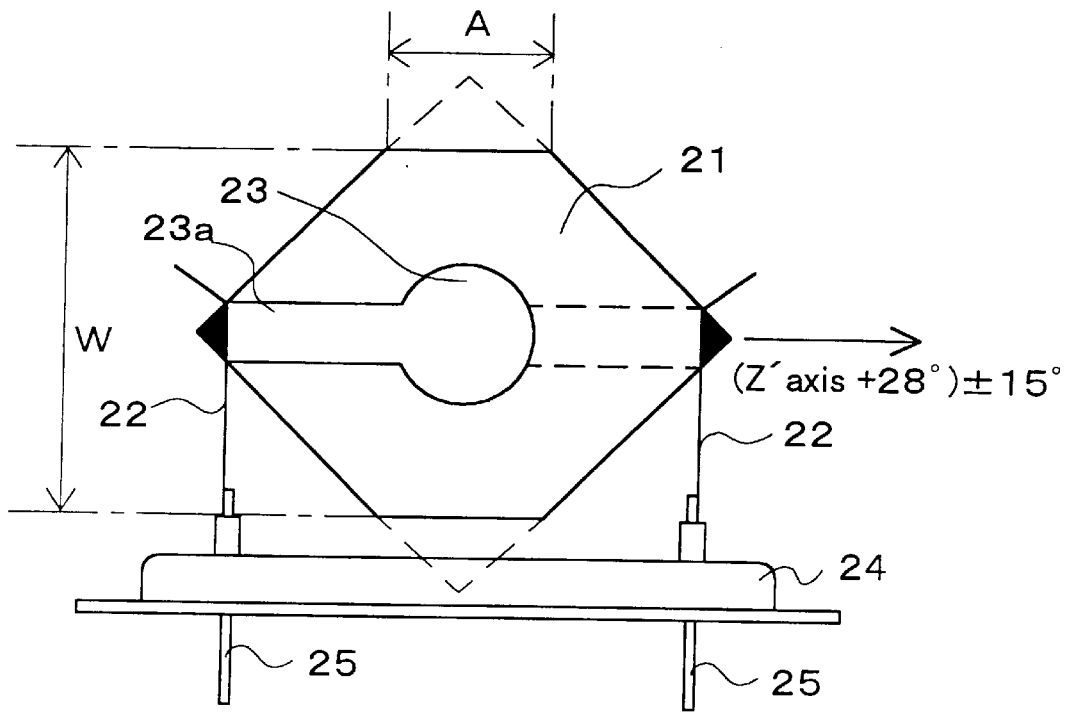
FIG. 3 is a front view showing a quartz crystal element as a preferable embodiment of the present invention.

The quartz crystal element illustrated in FIG. 3 uses an AT-cut quartz blank 21. The quartz blank 21 is a hexagon having three pairs of mutually parallel sides. A diagonal line parallel to the axis direction of zero stress sensitivity is a reference line above described, the ends of the diagonal line are holding ends. In practice, it is not necessarily required that the reference line is strictly identical to the axis direction of zero stress sensitivity. Specifically, there is an allowance of about ±15°. The reference line may be a direction perpendicular to the axis direction of zero stress sensitivity. In this embodiment, since the quartz 21 is an AT-cut type, the direction of the reference line is at 28° from Z' axis.

The quartz blank 21 is formed as a hexagon by using a square quartz plate one of whose diagonal line is identical to the above reference line; cutting the square plate at two corners perpendicular to the reference line, on the lines parallel to and at an equal distance from the reference line. In this figure, the cutting areas in the square plate are indicated with broken lines.

At the nearly central parts of the major surfaces of the quartz blank 21, circular excitation electrodes 23 facing each other are formed by, for example, vapor deposition. The excitation electrode 23 on one major surface is extended with a leading part 22a to one holding end, while the excitation electrode on the other principal plane to the other holding end.

When such a shape of quartz blank 21 is used for a quartz blank of a quartz crystal element, it should be mounted to a holding member by holding one or more portions. In the quartz crystal element shown, the quartz blank 21 is held by the holding members 22 at its holding ends. Each of two holding members 22 holding the quartz blank 21 is made of a conductive material and fixed to an end of a metal lead wire 25 implanted to the base 24. The base 24 is made of an insulating material, which ensures electrical insulation between the holding members 22. The holding members 22 may be, for example, thin metal strips facing each other, having a holding slot along the longitudinal direction. The quartz blank 21 is mounted in a manner that the ends of the holding areas penetrate the holding slots, and is adhered to the slots by applying a conductive adhesive. Thus, the quartz blank 21 is electrically and physically held. As described above, each excitation electrode 23 is electrically led to outside through the holding member 22 and the lead wire 25.

Figure 1:
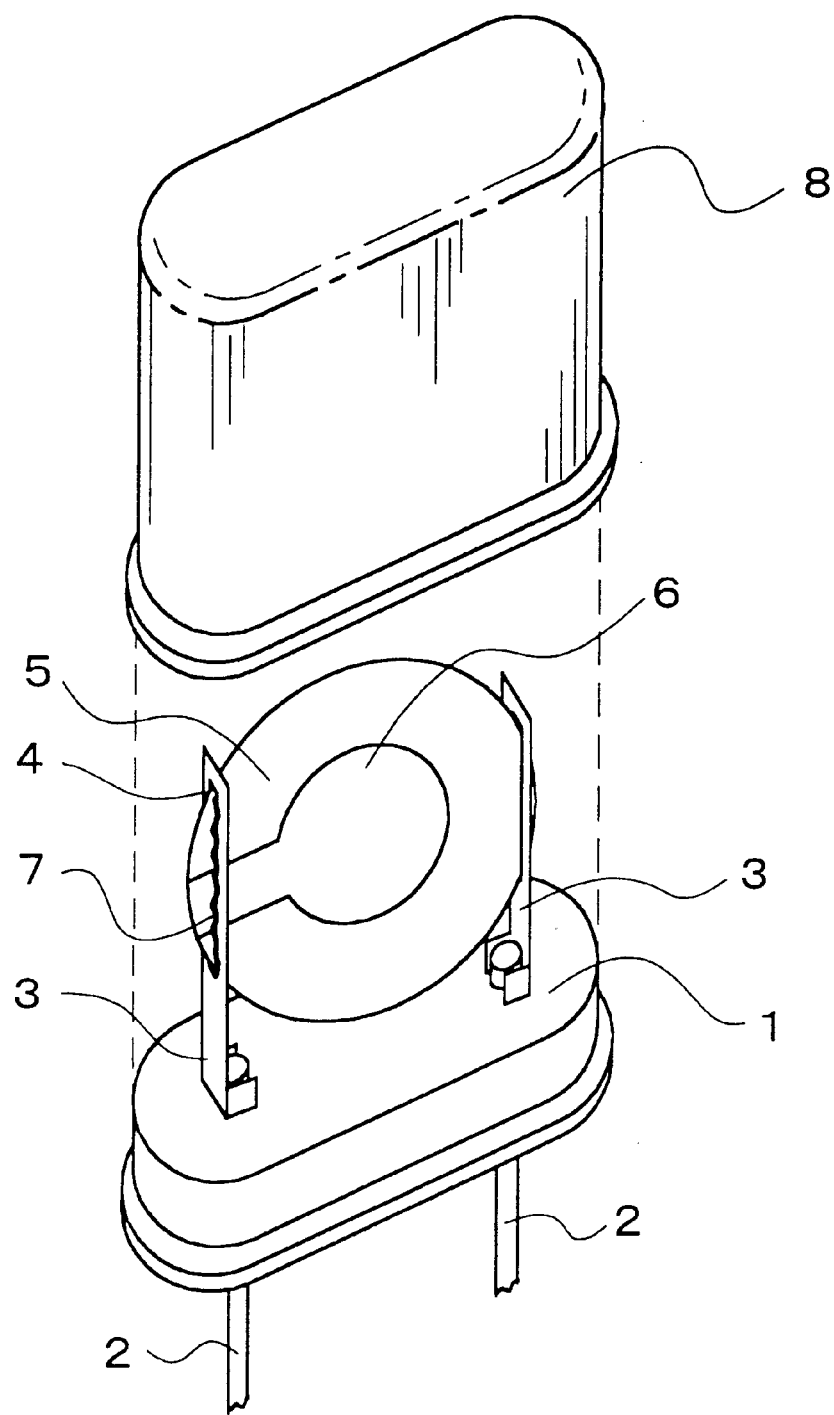
FIG. 1 is a perspective view of a conventional quartz crystal element where a quartz blank is enclosed in a metal case.

In this quartz crystal element, a metal cover is placed over the base 24 to tightly seal the quartz blank 21 as described for the conventional quartz crystal element shown in FIG. 1.

Figure 2:
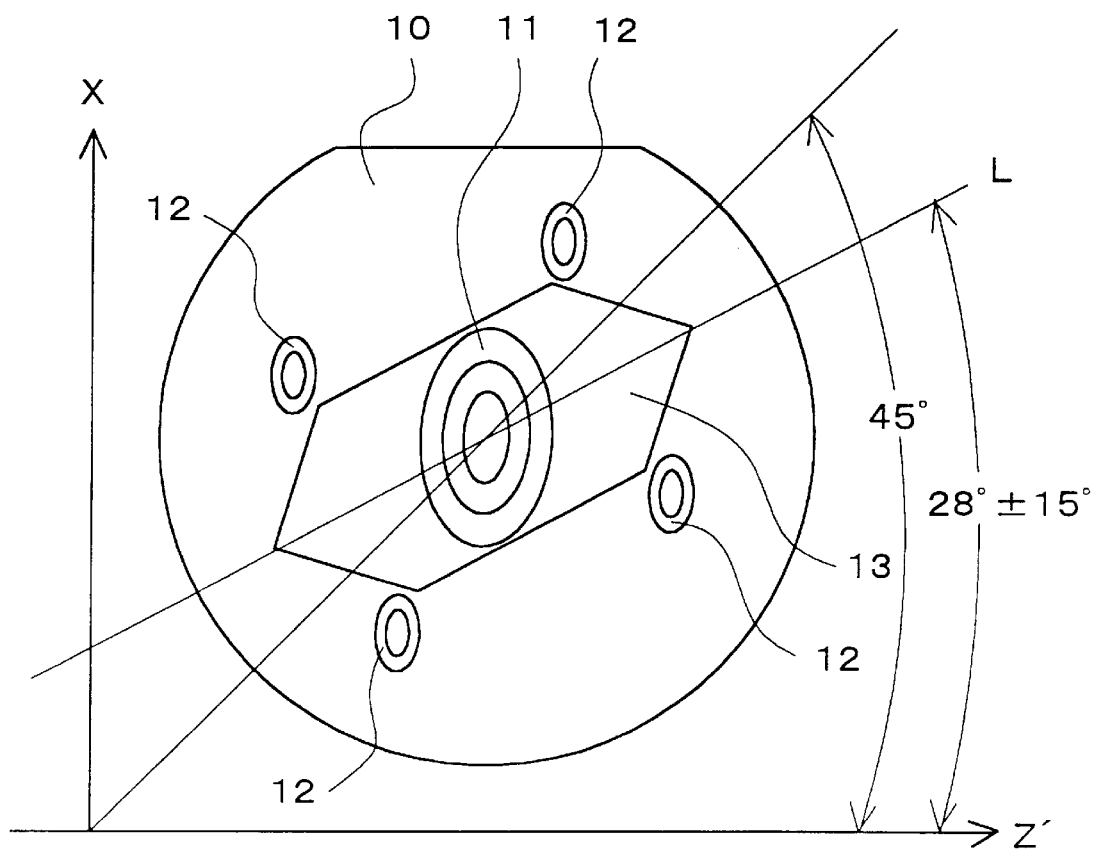
FIG. 2 is a view schematically showing a distribution of vibration displacement in an AT-cut quartz plate.

By preparing the quartz blank 21 as described above, a quartz blank 13 indicated by a solid line in FIG. 2 can be taken from a quartz plate which may provide principal and unwanted responses. Therefore, vibration characteristics are stable because in the quartz crystal element of this embodiment, the quartz blank 21 does not have portions in which strong unwanted response may be generated. Furthermore, in this embodiment are held the ends of the diagonal line which is a direction within 28°±15° from Z' axis of the AT-cut quartz blank, that is, the ends of the direction of zero stress sensitivity are held. It minimizes the effects of a stress from the holding member 22 on vibration characteristics. Alternately, the ends of a diagonal line perpendicular to the direction within 28°±15° from Z' axis of the AT-cut quartz blank may be held. It is desirable that the holding positions are in the direction of 28° from Z' axis. Practically satisfactory characteristics may be, however, achieved by selecting a direction within 28°±15°.

The size of the quartz blank 21 will be described.

In the light of elimination of unwanted-response generating areas, it is preferable that the apex angle of the quartz blank 21 at a holding end is right angle or an acute angle (less than 90°) although the mechanical strength of the holding end may be reduced when the apex angle is excessively small. The distance between the holding ends may be typically up to 5 mm for miniaturizing the entire quartz crystal element.

In the quartz blank 21, the width W of the direction perpendicular to the reference line is preferably at least 10% to up to 60% of the distance between the holding ends. If W is less than 10%, a crystal impedance may be too high to provide a practical quartz crystal element. If the width W is larger than 60%, secondary vibration may be liable to be generated.

Figure 4:
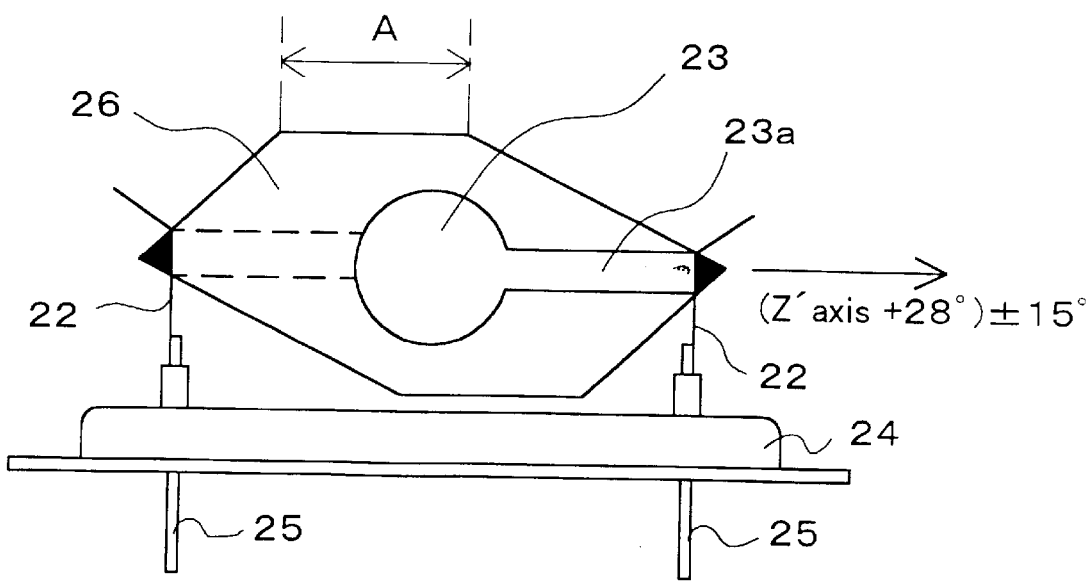
FIG. 4 is a front view showing a quartz crystal element as another preferable embodiment of the present invention.

A quartz crystal element of the present embodiment is not limited to the above specific one. For example, the holding member may be, instead of a thin plate, of a clip shape formed by bending a metal wire having a characteristic of spring. A shape of the quartz blank is not limited to one formed by cutting two corners from a square quartz plate, that is, a parallelogram whose four sides have an equal length and each of whose four vertices is a right angle. FIG. 4 shows a quartz crystal element using a quartz blank 26 formed as a hexagon from a parallelogram whose adjacent sides are different in their length. Using a distorted hexagonal quartz blank 26 which has three pairs of parallel sides, a quartz crystal element having good vibration characteristics may be provided even when positions of unwanted responses are unsymmetrical to a straight line of the direction of zero stress sensitivity.

As described above, the quartz crystal element of this embodiment can control generation of unwanted response even when using a markedly small quartz blank with a longitudinal dimension of up to 5 mm, and therefore provide a relatively high Q value without jumping of frequency associated with temperature change. Since the quartz blank is held in the direction of zero stress sensitivity, the effect of a stress from the holding members on vibration characteristics may be significantly minimized, resulting in more improved vibration characteristics.

In this type of quartz crystal element, the quartz blank is vertically held and enclosed in a metal case. Since the quartz crystal element according to the present embodiment is formed into a hexagon by cutting corners perpendicular to the longitudinal direction, the height of the quartz blank, when the quartz blank is held vertically, can be reduced. Reduction in the height of the quartz blank in this way may, therefore, lead to miniaturizing and lowering the quartz crystal element.

A manufacturing process for the above quartz crystal element will be described. As is well known, an AT-cut quartz plate which is a so-called rotated Y plate may be, for example, taken as a plane from an X–Z' plane rotated by about 35° around X axis of an artificial quartz crystal.

Figure 5:
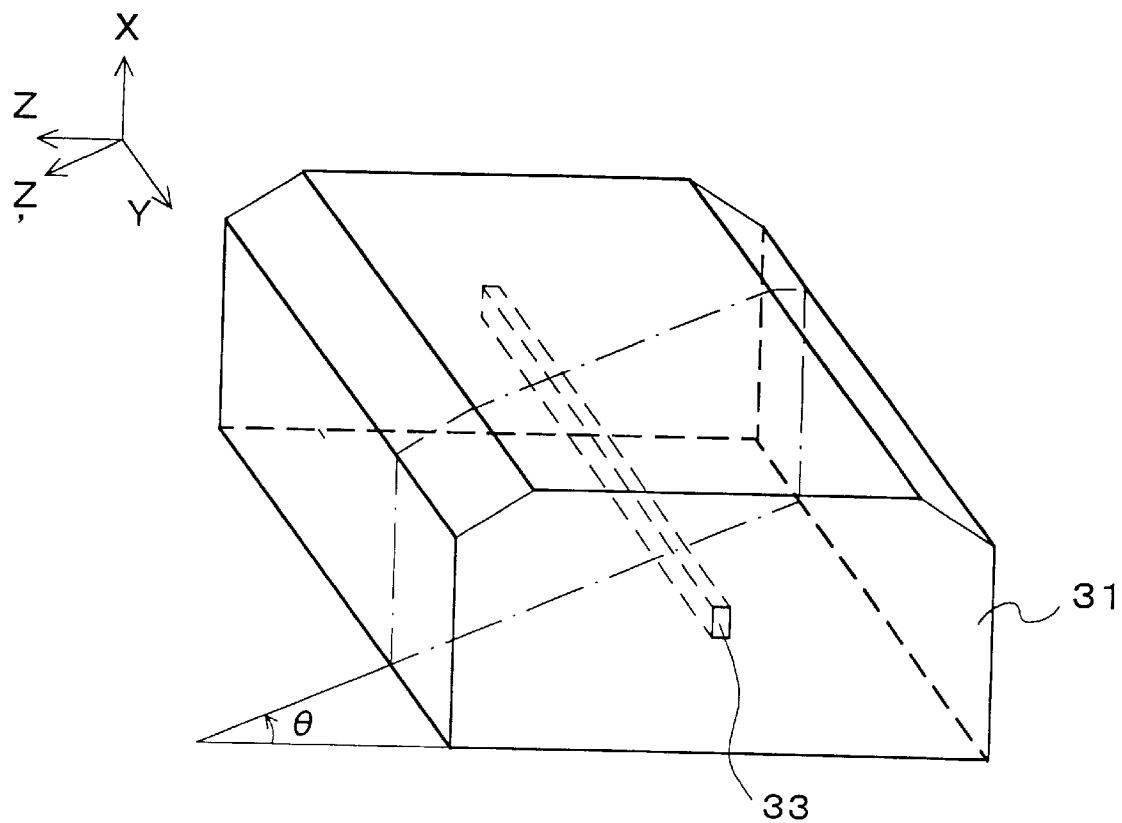
FIG. 5 is a perspective view showing a process of taking an AT-cut quartz plate from an artificial quartz.

As shown in FIG. 5, an artificial quartz stick 31 extending along the Y axis direction is prepared. At the central part of the artificial quartz 31, there remains a seed quartz 33 extending along the Y axis direction. The artificial quartz 31 is diagonally cut in the direction parallel to X axis and forming an angle θ (about 36°) with Z axis, to take a quartz plate 32 shown in FIG. 6. Since there remains the seed quartz 33 at the center of the quartz plate 32, the plate should be longitudinally divided into two parts along the center line, avoiding the seed. A plurality of the divided plates are sequentially piled to be formed as a stick, which is then shaped by grinding into a round stick. From the stick, each plate is removed to provide a circular quartz plate 34. The circular quartz plate 34 is ground with a thickness direction to a thickness corresponding to a desired resonance frequency with a grinder, and is then formed, by cutting peripheral portion of the quartz plate, into a hexagonal shape as described above to provide a quartz blank 35. Thus, a hexagonal quartz blank may be provided.

An efficiency in utilizing the area of the quartz plate 32 is, however, low in this procedure; a considerable part of the quartz plate 32 becomes cutting and grinding chips.

Hence, the present inventors have devised a process described below as an improved manufacturing method.

Figure 7:
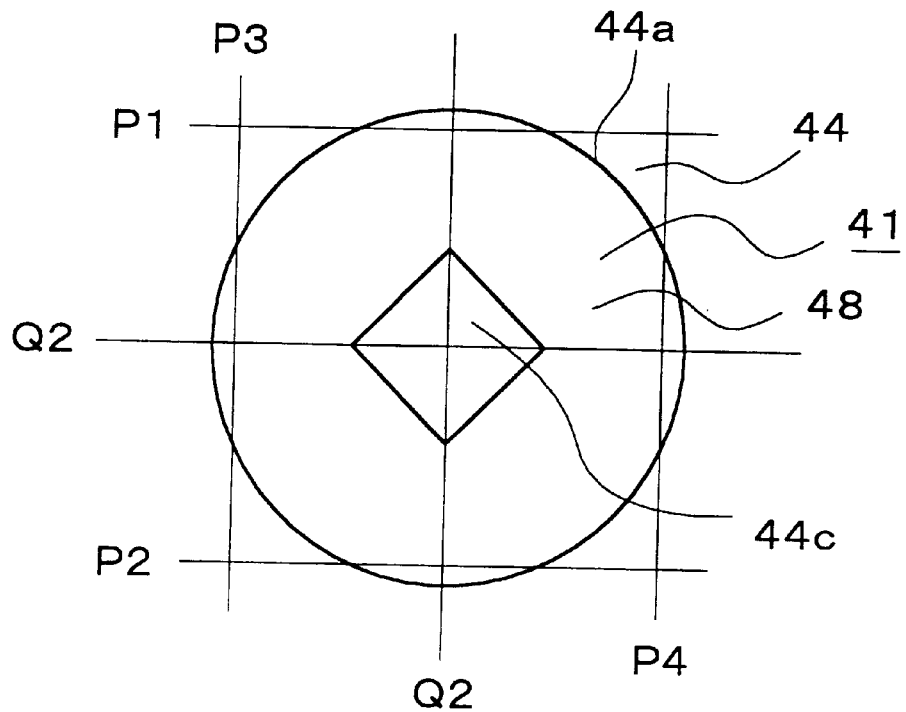
FIG. 7 is a view showing a process for taking a quartz blank from a quartz plate according to an improved method.
Figure 8:
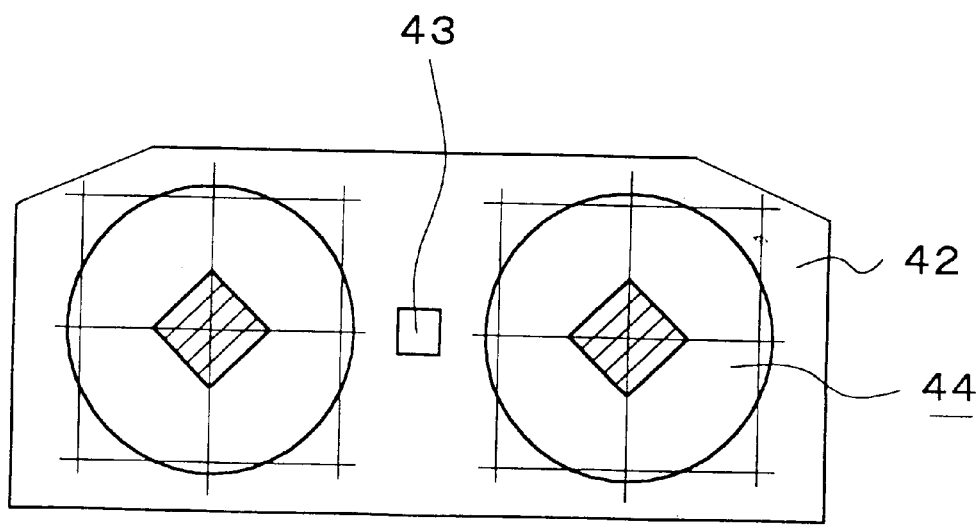
FIG. 8 is a view showing a process for taking the quartz blank from the quartz plate according to the improved method.

In FIG. 7, reference numeral 41 is a circular-shaped quartz plate. The quartz plate 41 is taken from an artificial quartz stick extending in the Y axis direction as shown in FIG. 5. The artificial quartz is diagonally cut in the direction parallel to X axis and forming an angle θ (about 36°) with Z axis, to take a quartz plate 42 shown in FIG. 8. Since there remains the seed quartz 43 at the center of the quartz plate 42, the plate should be longitudinally divided into two parts along the center line, avoiding the seed. A plurality of the divided plates are sequentially piled to be formed as a stick, which is then shaped by grinding into a round stick. From the stick, each plate is removed to provide a circular quartz plate 44.

The quartz plate 44 is ground with a thickness direction thereof to a thickness corresponding to a desired resonance frequency. Again, a plurality of the plates are piled into a circular stick, whose four peripheral parts are ground or cut into planes in a manner that the ground surfaces are parallel to the longitudinal direction and a center line of each ground part is arranged at every 90° from the center of the sectional circle. In FIG. 7, the ground surfaces are indicated by lines P1 to P4. Thus, the circular stick is formed to have a square section with an arc part at each corner.

Then, the circular stick is divided into four parts by cutting it along the planes parallel to individual sides of the above square and passing through the center of the quartz plate 44. The cutting planes are indicated by lines Q1 and Q2 in FIG. 7. The processing as above can provide a sectional shape of square with one arc corner 44a which is substituted for one apex portion of the square.

Figure 9:
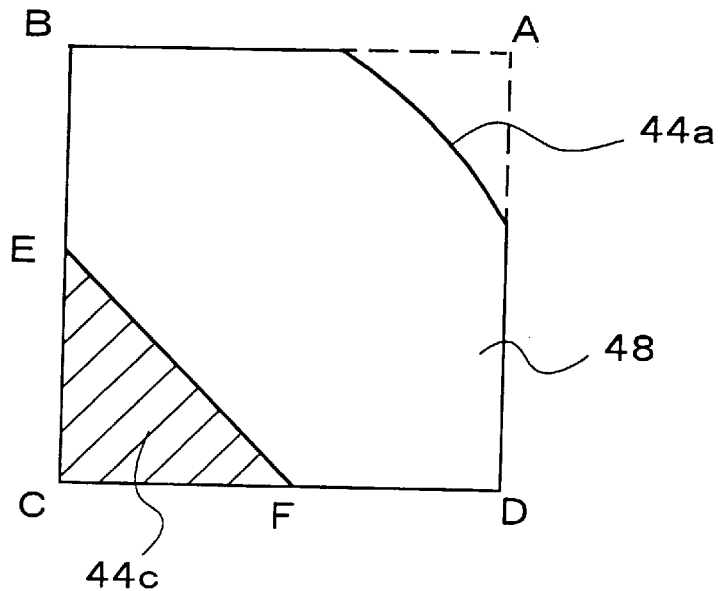
FIG. 9 is a view showing a process for taking the quartz blank from the quartz plate according to the improved method.

In other words, the sectional shape is a square ABCD in which the corner corresponding to the apex A is an arc 44a, as shown in FIG. 9. In the embodiment shown in this figure, the arc 44a extends from a nearly middle point of the line segment AB to a nearly middle point of the line segment AD. The direction of the line BD is in the direction or a direction perpendicular to the direction of the axis of zero stress sensitivity. In the present embodiment, since the quartz plate 44 is an AT-cut quartz plate, the direction of the line BD is set at 28°±15° or 118°±15° from the Z' axis direction. In addition, among four corner portions in the square ABCD, a given amount of the corner portion 44c facing to the arc 44a is removed by grinding or cutting. The removed part is indicated by the shaded area in FIG. 9. Then, each quartz plate is removed from the stick to provide a substantially hexagonal quartz blank 48.

The quartz blank 48 has a hexagonal shape with one side replaced with the arc 44a. Even if some of six sides are replaced with some types of curve, the effects of this invention may not be affected, and good vibration characteristics may be achieved by controlling unwanted responses.

Figure 10:
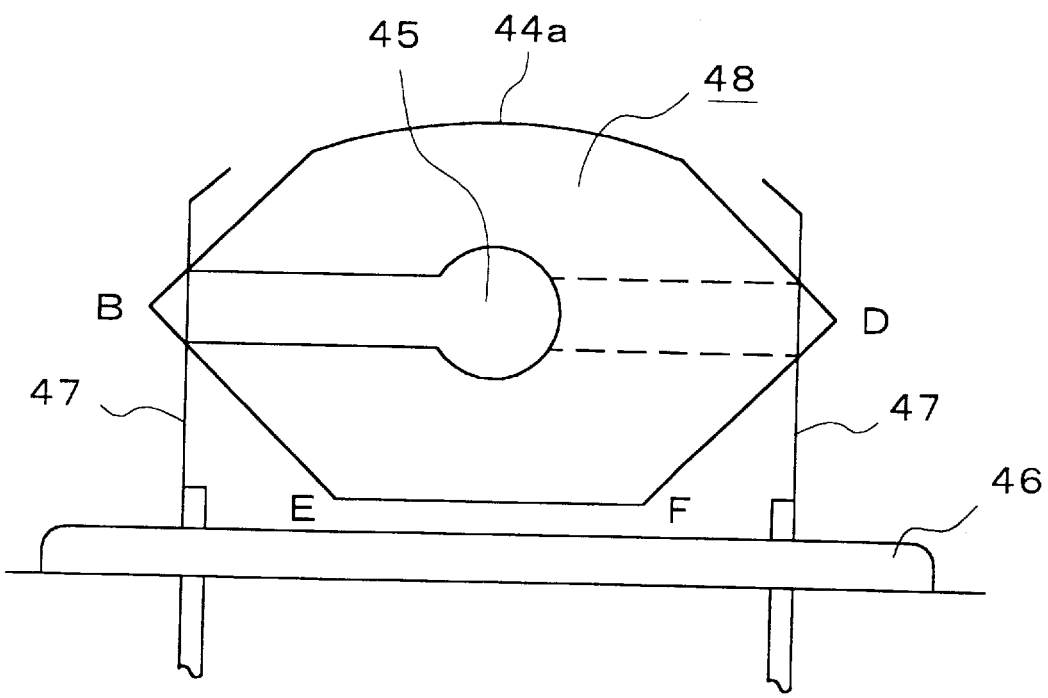
FIG. 10 is a front view showing a quartz crystal element using the quartz blank taken from the quartz plate according to the improved method.

As shown in FIG. 10, excitation electrodes 45 facing each other are formed on both major surfaces of the quartz blank 48. The excitation electrode 45 on the front surface is led to the apex B, while that on the back surface to the apex D. The apexes B and D are held by a pair of holding members 47 implanted to the base 46.

Figure 6:
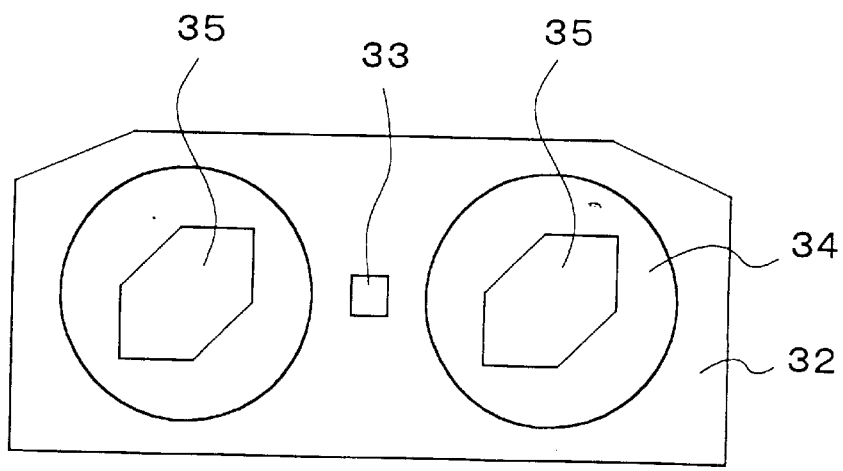
FIG. 6 is an front view showing a process for taking a quartz blank from a quartz plate.

In the process described in terms of FIGS. 5 and 6, one hexagonal quartz blank is obtained from one circular quartz plate, while according to the process just described, one circular quartz plate are divided into four quartz blanks, improving a productivity up to four times. Furthermore, in the above process the piled plates as a stick is divided into four parts, which may provide good workability and enable the plates to be effectively processed by, for example, cutting and grinding.

A preferable holding method of a quartz blank will be described. In the present invention, a quartz blank is preferably held at corners with an acute angle. When the quartz blank is held at corners with an acute angle, the length held by the slits of the holding members are shorter than that in holding a circular quartz blank, which may lead to deterioration of shock resistance as a quartz crystal element. Thus, the slot of the holding member can be formed in a shape which is narrower in a lower portion.

Figure 11:
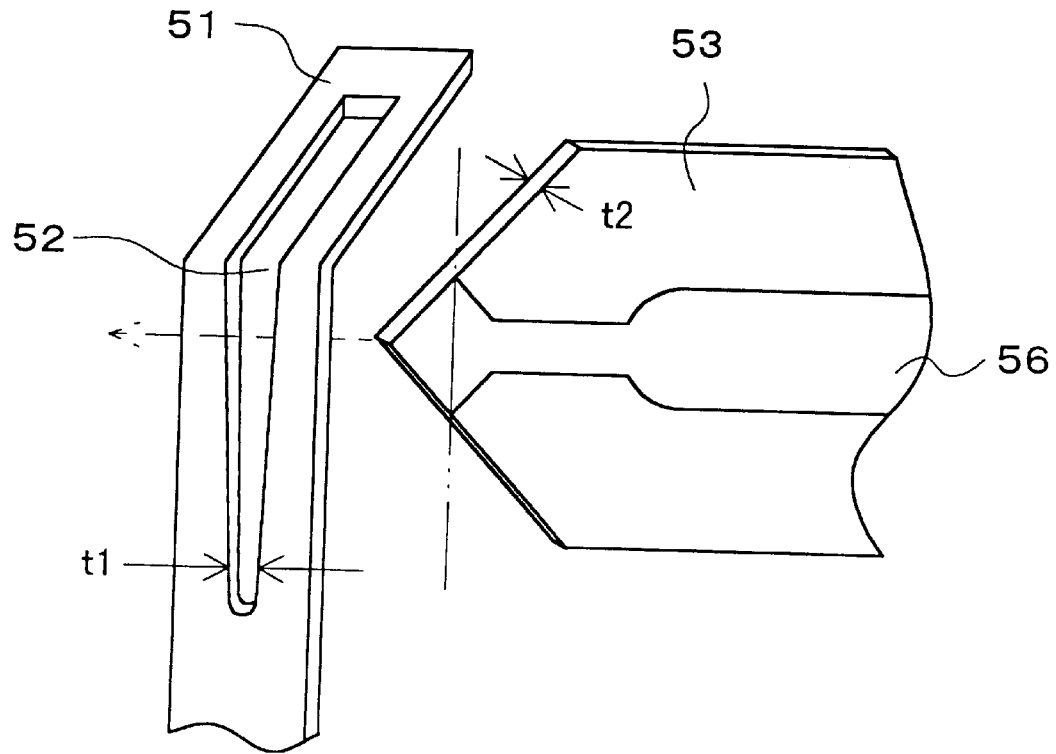
FIG. 11 is an enlarged view showing a holding area for a quartz blank.

In FIG. 11, a holding member 51 consists of a thin metal strip, whose upper portion is bent to an inner direction. The holding member 51 has a longitudinal slot 52, which passes through the bending portion and has a taper shape which is narrower in the lower portion in this figure. When t1 and t2 represent the widths of the slot 52 at the bottom end and the thickness of the quartz blank 53 inserted into the slot 52, respectively, there is a relationship of t1<t2 although around the bending portion of the holding member 51 the width of the slot 52 is larger than the thickness t2.

Figure 12:
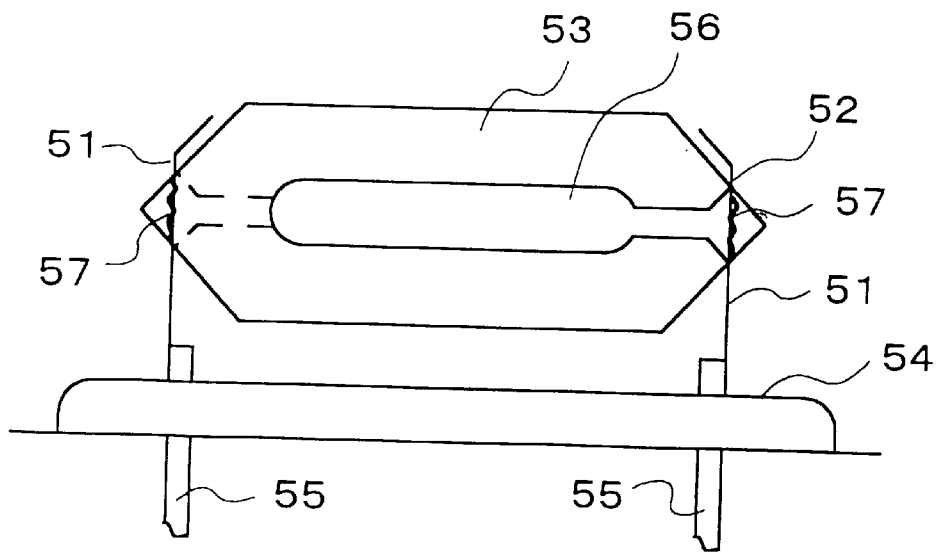
FIG. 12 is a front view showing a quartz crystal element as another preferable embodiment of the present invention.

As shown in FIG. 12, to the base 54 a pair of lead wires 55 penetrating it are mounted. The lower end of each holding member 51 is fixed on the top of the lead wire 55 by, for example, welding. Thus, a pair of holding members 51 are placed facing each other.

A quartz blank 53 is inserted between the facing sides of a pair of holding members 51 placed as above, where each end of the quartz blank 53 is inserted into a slot 52. The quartz blank 53 may be hexagonal, as described above. When using a subminiature quartz blank in which the distance between the ends is about 5 mm, the direction between the ends corresponding to the slots 52 is preferably identical to the axis direction of zero stress sensitivity. The use of a quartz blank 53 having such an axis direction may eliminate areas containing a possible center of unwanted response generated near a holding end, resulting in suppression of unwanted response and thus in good vibration characteristics.

Excitation electrodes 56 facing each other are formed on both major surfaces of the quartz blank 53. The excitation electrodes 56 have a shape of a stretched circle. The excitation electrode 56 on the front surface is led to the plate end corresponding to one holding member 51, while that on the back surface to the plate end corresponding to the other holding member. The ends extended from the excitation electrodes 56 are inserted into the slots 52.

The quartz blank 53 whose ends are inserted into a pair of slots 52 slides down by its own weight until the ends are caught by the slots 52, and then be fixed. Then, a conductive adhesive 57 is applied to the contacting portions between the slots 52 and the quartz blank 53 to ensure holding the quartz blank 53 in the slots 52 and electric conduction between the excitation electrode 53 and the lead wire 55 through the holding member 51.

Of course, a cover (not shown) is placed over the base 54 to tightly seal the quartz blank 53 after holding the quartz blank 53 as described above.

When holding a hexagonal quartz blank, particularly when holding the quartz blank at the acute angular apexes, the width held by the slot of the holding member is narrower than when holding a circular quartz blank. However, a holding member having a slot with an appropriate taper angle according to the above holding method makes it feasible to firmly hold a quartz blank with a wide range of thickness, that is, a wide range of frequency. Strictly saying, a distance between the base 54 and the bottom side of the quartz blank 53 may vary depending on the thickness of the quartz blank 53. However, the quartz blank 53 can be held at an appropriate position regardless of the thickness, by selecting the taper angle formed in the slot 52 as appropriate.

Thus, using the slot of the holding member with a taper shape which is narrower in a lower portion may provide a quartz crystal element having good vibration resistance, good shock resistance and reduced aged deterioration. It may make standardization of a holding member possible, leading to easy control of components and cost reduction.

Figure 13:
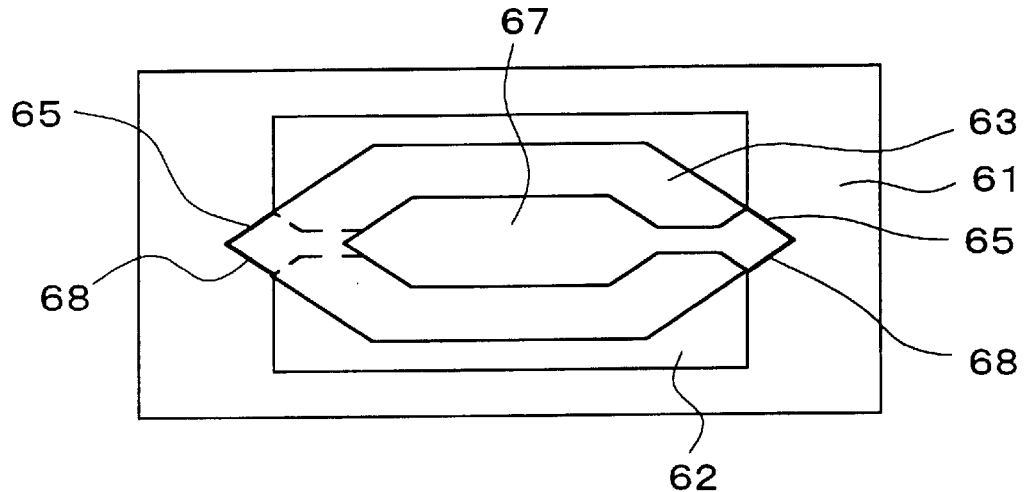
FIG. 13 is a perspective view showing a case for a surface-mounting quartz crystal element according to the present invention.
Figure 14:
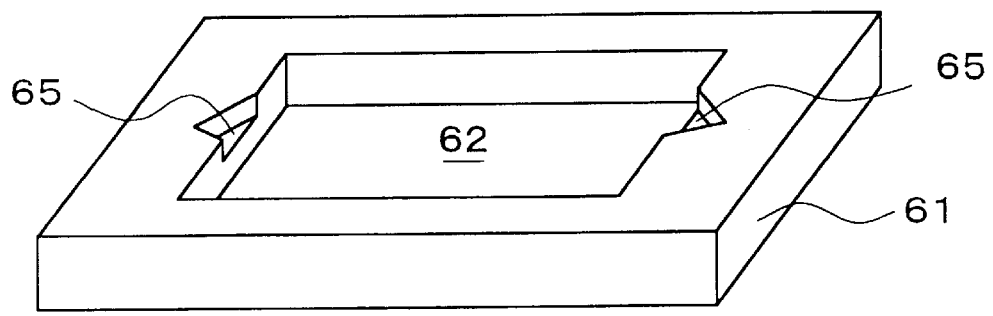
FIG. 14 is a top view showing a configuration of the quartz crystal element of FIG. 13 in the case, to which a quartz blank is mounted.
Figure 15:
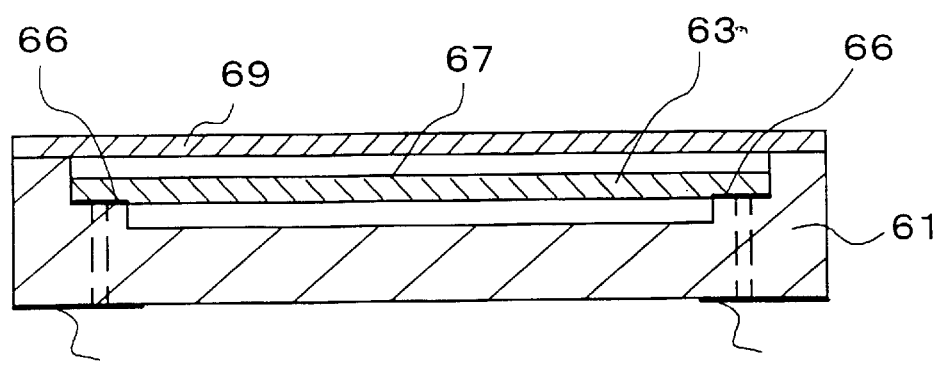
FIG. 15 is a sectional view showing the quartz crystal element shown in FIG. 13.

A holding method of a hexagonal quartz blank is not limited to one where the quartz blank is vertically held by a pair of holding members. When a quartz crystal element is surface-mounted on a printed wire board, it is necessary to reduce the height of the quartz crystal element. In such a case, it is preferable that the quartz blank is horizontally held in a case. FIGS. 13 to 15 show such a surface-mounting type of quartz crystal element.

An almost rectangular solid case 61 is made of an insulating material such as ceramics. A rectangular concave 62 is formed on the top face of the case 61. The depth of the concave 62 is adequately larger than the thickness of the quartz blank 63 to be enclosed in the case 61. The length of the longer side of the concave 62 is somewhat shorter than the distance between the holding ends of the hexagonal quartz blank 63. An almost triangular notch shallower than the concave 62 and deeper than the thickness of the quartz blank 63 is formed at an almost central position of each shorter side of the concave 62. When each shorter side of the concave 62 is defined as a side wall of the concave, the notch 65 is formed as a step for the side wall. The shape of the notch 65 fits that of the holding end of the quartz blank 63. The distance between the tips of the notches 65 is equal to or a little longer than the length between the holding ends of the quartz blank 63.

For such a case 61, the quartz blank 63, each of whose holding ends is engaged with the notch 65, is held in space in the concave 62 and enclosed in the case 61.

On the outer bottom surface of the case 61, a pair of external electrodes 64 are formed. The external electrodes 64 are used for electrically connecting a conductive pattern of a printed wire board and a quartz crystal element, when the quartz crystal element is surface-mounted on the printed wire board. A holding electrode 66 is formed on the bottom of each notch 65, that is, the surface contacting with the holding end of the quartz blank 63. Each of the holding electrodes 66 is electrically connected with the external electrode 64 through, for example, a via-hole wiring layer.

The quartz blank 63 may be, for example, of AT-cut, which is taken from an artificial quartz and in which a direction of a straight line passing both holding ends is within 28°±15° or 118°±15° from Z' axis. On both major surfaces of the quartz blank 63, excitation electrodes 67 facing each other are formed by, for example, vacuum vapor deposition. The excitation electrode 67 on the top surface is led to the plate edge corresponding to one holding end, while that on the back surface to the plate edge corresponding to the other holding end. Here, the excitation electrode 67 is hexagonal, which is substantially similar to the shape of the quartz blank 63. Here, "substantially similar" means that its shape except the lead to the holding end is similar to the shape of the quartz blank 63.

In the quartz crystal element, the holding end of the quartz blank 63 is supported by the notch 65, and a conductive adhesive 68 is applied to ensure electric conduction between the lead end of the excitation electrode 67 of the quartz blank 63 and the holding electrode 66.

Finally, a cover 69 is placed over the concave 62 of the case 61, and is sealed with, for example, molten glass to tightly enclose the quartz blank 63 in the concave 62 to provide a surface-mounting type of quartz crystal element.

Since the quartz blank 63 is supported by the notch 65 corresponding to the shape of the holding end and a conductive adhesive 68 is applied to this quartz crystal element, it is easy to accurately position the quartz blank 63. Furthermore, since the cover 69 is placed over the opening of the concave formed on the top surface of the case 61 and is fixed by, for example, adhesion, the quartz crystal element can be designed in a manner that there exists a relatively wider adhesion area on the top surface of the case 61. It makes it easier to seal the case with a reliable tightness.

The surface-mounting type of quartz crystal element as described above can be readily and inexpensively manufactured as a subminiature element having good vibration characteristics. In the surface-mounting type quartz crystal element, the case may be made of a low-cost material such as glass, instead of ceramics. In addition, the cover may be sealed by, for example, seam welding, instead of adhesion.

What is claimed is:

1. A quartz crystal element comprising:
   a substantially hexagonal quartz blank taken from an AT-cut quartz plate;
   a pair of holding members for holding the quartz blank;
   a first excitation electrode formed at a central portion of a first major surface of the quartz blank; and
   a second excitation electrode formed at a central portion of a second major surface of the quartz blank;
   wherein each pair of three pairs of opposite sides of the quartz blank are mutually parallel, one pair of the three pairs of the opposite sides are parallel to a longest diagonal line of the quartz blank, the direction of the longest diagonal line is within the range of 28°±15° from a Z' axis direction of the quartz blank, the holding members hold the quartz blank at holding ends which are the ends of the longest diagonal line, the first excitation electrode is led to one end of the longest diagonal line, and the second excitation electrode to the other end;
   wherein at least one of the sides parallel to the longest diagonal line has the shape of arc.

2. The quartz crystal element according to claim 1, further comprising a base for retaining the holding members facing each other, wherein each of the holding members is made of a conductive material and has a penetrating hole, and the quartz blank is held by inserting the holding ends into the penetrating holes and applying a conductive adhesive around areas of the penetrating holes.

3. The quartz crystal element according to claim 1, wherein a length of the longest diagonal line of the quartz blank is up to 5 mm.

4. The quartz crystal element according to claim 1, wherein a length between a pair of the opposite sides parallel to the longest diagonal line is at least 10% to up to 60% of a length of the longest diagonal line.

5. The quartz crystal element according to claim 1, wherein each of the excitation electrodes has a shape substantially similar to that of the quartz blank.

6. A quartz crystal element comprising:

a base;

a pair of lead wires implanted in the base;

holding members, each of which is fixed at an end of each of the lead wire, is made of a strip-shaped metal sheet, and has a longitudinal slot;

a substantially polygonal quartz blank;

a first excitation electrode formed at a central portion of a first major surface of the quartz blank; and a second excitation electrode formed at a central portion of a second major surface of the quartz blank;

wherein the first excitation electrode is led to a first apex of the quartz blank, while the second excitation electrode is led to a second apex of the quartz blank;

a width of the slot at a lower end of the slot is narrower than a thickness of the quartz blank, and the slot is narrower in a lower portion thereof and broader in a higher portion thereof, and thus has a portion with a broader width than the thickness of the quartz blank; and the quartz blank is held by inserting the first and the second apexes into the slots and then applying a conductive adhesive around the slots.

7. The quartz crystal element according to claim 6, wherein the quartz blank has a substantially hexagonal shape in which ends of a longest diagonal line of the quartz blank are the first and the second apexes.

8. The quartz crystal element according to claim 7, wherein a direction of the longest diagonal line is within a range of $28°\pm15°$ from a direction of a Z' axis.

* * * * *